United States Patent [19]

Dahmani et al.

[11] Patent Number: 4,907,237
[45] Date of Patent: Mar. 6, 1990

[54] OPTICAL FEEDBACK LOCKING OF SEMICONDUCTOR LASERS

[75] Inventors: Brahim Dahmani, Paris, France; Leo W. Hollberg, Englewood, Colo.

[73] Assignee: The United States of America as represented by the Secretary of Commerce, Washington, D.C.

[21] Appl. No.: 259,088

[22] Filed: Oct. 18, 1988

[51] Int. Cl.[4] .............................................. H01S 3/13
[52] U.S. Cl. ........................................ 372/32; 372/18; 372/75; 372/26
[58] Field of Search ..................... 372/29, 18, 93, 95, 372/92, 69, 75

[56] References Cited

U.S. PATENT DOCUMENTS

| | | | |
|---|---|---|---|
| 4,221,472 | 9/1980 | Smith et al. | 372/31 |
| 4,446,556 | 5/1984 | Koepf | 372/71 |
| 4,713,818 | 12/1987 | Lee | 372/8 |
| 4,730,105 | 3/1988 | Mitschke et al. | 372/31 |
| 4,751,705 | 7/1988 | Hadley et al. | 372/18 |

Primary Examiner—Leon Scott, Jr.
Attorney, Agent, or Firm—Thomas Zack; Alvin J. Englert; Harold L. Novick

[57] ABSTRACT

An optical method and apparatus is disclosed for stabilizing the frequency of semiconductor lasers. The basic system includes only the optical elements of a conventional semiconductor laser optically coupled to a separate, external resonator having an optical cavity with a particular resonance frequency. The optical geometry is configured such that the output from the resonator is fed back to the laser only when the laser frequency matches or substantially matches the resonance frequency. In other disclosed embodiments, optical electronic feedback loops are used to modulate the laser injection current to stabilize the frequency and to adjust the phase of the optical feedback signal.

15 Claims, 5 Drawing Sheets

OPTICAL FEEDBACK LOCKING OF SEMICONDUCTOR LASERS

FIELD OF THE INVENTION

The present invention relates to the field of laser frequency stabilization, and in particular relates to a method and apparatus for the stabilization of the laser center frequency and reduction of the laser linewidth of semiconductor laser diodes. Background of the Invention

BACKGROUND OF THE INVENTION

Semiconductor lasers are increasingly being used in commercial applications. However, these diodes generally have the problem of a broad spectral linewidth and in many applications, such as in the communications field, it is necessary to have a laser with a higher spectral purity, as well as a laser having a stabilized and controlled oscillation center frequency. This growing need has stimulated a plethora of semiconductor laser frequency stabilization techniques.

One broad class of frequency stabilization techniques utilizes some form of optical feedback. In this technique, a predetermined fraction of the laser's output power is returned to the laser from an optical element, such as a single external reflector, a grating, a thin glass plate, a fiber Rayleigh scattering device, and a phase conjugate mirror. (See e.g., F. Favre and D. LeGuen IEEE J. Quantum Electron. QE-21 1937 (1985) and references herein.) Vahala et al, 49 Applied Physics Letters 1563 (1986). The extreme limit of the optical feedback method is the extended cavity or the "external cavity laser." In this method, the semiconductor gain medium is located inside a larger optical resonator. The external cavity laser has spectral characteristics that can be quite good and these characteristics are often comparable to other laser systems, such as dye and gas laser systems.

Other known methods to obtain narrow linewidths and frequency control include optical injection locking using a stable master oscillator as the source or a second type of approach utilizing electronic-servocontrol to stabilize the diode laser frequency to a separate frequency reference. Such a separate frequency reference can be obtained from a resonant cavity or an atomic resonance device.

A third approach for diode laser frequency stabilization includes a hybrid method that utilizes electronic and optical feedback, the latter coming from a fiber optic cavity. (See e.g. Favre et al, 21 IEEE J. Quantum Electron 1937 (1985). In addition, some recent studies are reporting that it is possible to stabilize semiconductor laser frequency by establishing feedback from a monolithic coupled grating system. However, because of the intrinsic spectral characteristics of semiconductor laser frequency noise, the only systems which have been found to achieve substantial linewidth reduction are those which incorporate some form of optical feedback, or which use very fast electronic servos (typically requiring servo-bandwidths of 20 MHz or greater).

Standard designs of semiconductor lasers have very short optical cavities (typically a few hundred microns) and have relatively low reflectivity mirrors. The resulting laser resonator has a low Q (quality factor). For a number of reasons that are related to the physics of the interaction between the optical field and the carriers in the semiconductor, the semiconductor lasers also show excess frequency noise. When these two factors are combined, they result in diode lasers having relatively broad spectral widths, the narrowest of which are on the order of tens of megahertz wide. Thus, the conventional semiconductor lasers are unacceptable for many applications because of their broad spectral widths and the instabilities in their oscillation frequency. Furthermore, the oscillation frequency of a free running semiconductor laser is strongly dependent on the injection current, the operating temperature and the optical feedback.

There are numerous United States patents which disclose optical feedback in semiconductor lasers. Many of these use a Fabry-Perot resonator, such as the one disclosed in the Kaminow Patent 4,198,115, incorporated herein by reference. The following patents are typical: Hadley et al, No. 4,751,705 (optical injection in a single end-element of a semiconductor laser array to lock the array output); Smith et al No. 4,556,980 (injection locked semiconductor laser using a gas laser produces a narrow linewidth and frequency control); Haus et al No. 4,464,759 (semiconductor diode laser with microwave mode locking); Dutcher et al No. 4,752,931 (injection seeded Q switch laser with selectively introduced light from a master oscillator); Fujita et al No. 4,677,630 (frequency stabilization technique utilizing optical feedback of a fraction of the laser output); Beene et al No. 4,606,031 (electro-optical feedback to a transducer to change the resonant characteristics within the laser cavity); Smith et al No. 4,221,472 (optical and electronic feedback utilizing a Fabry-Perot interferometer to adjust cavity length); Liu No. 4,181,899 (a glass laser utilizing an opto-electric Fabry-Perot resonator located within the laser cavity to tune the laser); and Byer No. 4,455,657 (optical injection locking to stabilize a high gain laser).

The foregoing references illustrate current approaches to the solution of laser stabilization. However, none of the approaches in the disclosed references have the performance with respect to linewidth and frequency stability that the present invention provides. Unfortunately, the frequency modulation capabilities are usually sacrificed when the laser linewidths are reduced by optical feedback. With most of the frequency stabilization techniques, there has been found to be a trade-off between the size of the diode laser's linewidth and its FM capabilities. Usually, a one-to-one correspondence has existed between these quantities such that if the laser linewidth is reduced by a factor of ten, its FM sensitivity to injection current, (typically on the order of 3 GHz/ma) is also reduced by roughly the same factor of ten.

The theory for optical feedback in lasers is still being developed. An early publication that describes one possibly acceptable explanation, coauthored by the inventors of the present invention, is Hjelme et al, "Novel Optical Frequency Stabilization of Semiconductor Lasers," Topical Meeting on Semiconductor Lasers, Feb. 10–11, 1987, Albuquerque by Optical Society of America, incorporated herein by reference. This article explains the theory with reference to a diagram of a conventional optical feedback arrangement using a Fabry-Perot confocal cavity set up in a conventional "FIG. 8" arrangement to lock the laser frequency. Although this diagram is very similar to FIG. 8 herein, the article presents a conventional approach to explain the theory being proposed and is nonenabling as to the present invention because of some very critical omissions. Nevertheless, the article is helpful to provide the theoretical background necessary to fully appreciate the present invention.

SUMMARY OF THE INVENTION

The present invention overcomes the foregoing problems with semiconductor lasers. With the present invention, the technique of utilizing optical feedback locking to narrow the semiconductor linewidths does not sacrifice the ability to modulate the laser frequency via the injection current. The present invention utilizes the optical feedback locking technique to automatically lock the frequency of a semiconductor laser. The present invention uses to advantage the strong coupling of the laser optical field to the carrier density in the semiconductor laser. This coupling results in laser gain conditions that are highly sensitive to optical feedback. Only a small amount of optical power needs to be fed back into the laser which means that the locking method of the present invention does not deplete the useful laser output in any significant way.

Some of the important features of the present invention include a resulting linewidth that is dramatically reduced from that of a free running semiconductor laser where the linewidth reduction goes from approximately 20 MHz to as low as 3 kHz. The laser center frequency is also automatically stabilized using the high sensitivity of semiconductor lasers to optical feedback. The present invention also takes advantage of the spectral filtering characteristics of a high-Q resonent cavity to stabilize the frequency of the semiconductor laser. Another particularly useful feature of the present invention is that the laser linewidth is narrowed without sacrificing the modulation capabilities of the laser. For single frequency operation, the present invention permits a stabilization of the laser frequency by purely optical means, thereby eliminating costly and troublesome electronic controls. Furthermore, for some of the semiconductor lasers, the optical locking of the present invention also reduces the intensity noise on the laser output.

The present invention appears to be a solution to many of the problems encountered in the fields of optical communication systems, precision measuring systems, frequency synthesis systems and length metrology systems, as well as applications uncovered in basic research. By solving the frequency stabilization problem of semiconductor lasers, the broader use of this type of laser is greatly promoted.

The present laser locking apparatus and method contrasts with the prior art systems in that the laser sees an optical feedback or an enhanced feedback, depending on the implementation, only when the laser frequency matches the resonate frequency of a reference cavity. By utilizing resonant optical feedback, the present invention is able to take advantage of the high sensitivity of the laser to optical feedback to actually narrow the laser's spectral width while simultaneously stabilizing its oscillation frequency. For the purposes of the present disclosure, the term "resonate" or "resonant" means that the optical feedback occurs only when, or is enhanced only when, the laser frequency matches a resonance of a separate optical resonator. Direct modulation of the injection current of lasers according to the present invention can provide a high FM modulation index while the very narrow linewidth and frequency stabilization produced by the optical feedback lock is maintained.

Thus, the principal concept behind the present invention is to use an optical feedback locking technique that encompasses an established weak resonant feedback from a high-Q (relative to the Q of the diode laser cavity) optical resonator.

Other features and advantages of the present invention will be set forth in, or apparent from, the detailed description of the preferred embodiments.

DETAILED DESCRIPTION OF THE PREFERRED EMBODIMENTS

Reference is now made to the drawings in which like elements in the several views are denoted by like numerals. In particular, with reference to FIG. 1, a preferred implementation of the present invention is depicted in one of many configurations. In each embodiment of the present invention, the components are arranged so as to provide an enhanced optical feedback only at the resonance frequency of the separate resonating cavity.

Figure 1:
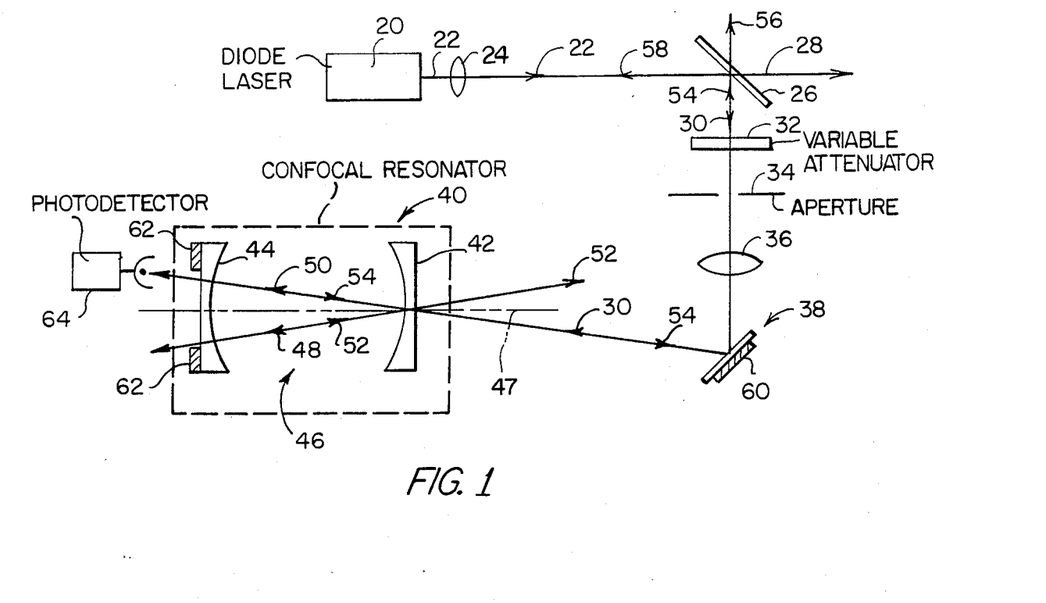
FIG. 1 is a schematic block diagram of one embodiment of a stable semiconductor laser in accordance with the invention.

The system according to the present invention comprises a conventional semiconductor diode laser 20 having an output beam 22. An exemplary laser is the commercially available, single-mode, 850 nm, GaAlAs laser. Such lasers have been used in tests without any special preparations or modifications. These lasers had free-running, unperturbed laser linewidths of approximately 20 to 50 MHz.

Laser output 22 is directed through a focusing lens 24 onto a conventional beam splitter 26 that can simply be a partially silvered mirror. Beam splitter 26 divides the coherent light beam 22 into an output beam 28 and a sampled beam 30. Beam splitter 26 is designed so that only a small fraction, as low as 4% of the output power from diode laser 20, is diverted from beam 22.

Sampled beam 30 is first directed through a variable attenuator 32, through an aperture 34 and a mode matching lens 36 to a mirror 38 arranged to change the direction of beam 30 and transmitted into a separate, optical confocal Fabry-perot resonator, or optical locking cavity, 40. Variable attenuator 32 was utilized in an experimental mode in order to study the feedback power dependence of the locking process. Aperture 36 blocks the unwanted feedback while passing the desired feedback. Lens 36 is used to mode match laser sampled beam 30 into confocal resonator 40. As depicted in FIG. 1, mirror 38 directs beam 30 into confocal resonator 40 on a path that is off the axis of resonator 40.

Resonator 40 is comprised of an input or right-hand mirror 42 and an output or left-hand mirror 44 that have substantially the same characteristics. Mirrors 42 and 44 are separated so as to form a confocal reference cavity therebetween, the mirror separation being equal to the mirror radius. Mirror 38 directs sampled beam 30 into resonator 40 off axis (i.e., at an angle to the symmetry axis of cavity 46). In this way, mirror 42 splits sampled beam 30 into a reflected portion 52 and a transmitted beam portion 50. Four beams exit resonator 40, two passing through each mirror 44 and 42 so as to create a four-port device. Because of the configuration of mirrors 42 and 44 and the input alignment, two beams exit from mirror 42, these are type I beam 52 and type II beam 54. It is important to note that beams 52 and 54 have different characteristics. The type I beam 52 is a combination of the reflected portion of beam 30 and the transmitted portion of the resonate field inside cavity 46 resulting from mirror 44. Type I beam has a power minimum when laser frequency matches a cavity resonance. In contrast, the three outputs of the type II beams, namely the beams exiting resonator 40 through mirror 44 and beam 54, contain only the transmitted portion of the cavity resonate field. Thus, each of these three outputs have the desired characteristic of a power maximum only when the laser frequency matches the cavity resonance frequency.

A geometry of FIG. 1 is only one possible arrangement to have the resonant optical feedback of type II (i.e., the maximum feedback at the resonance frequency) while avoiding the complications inherent in the directly reflected beam contained in output type I. This system has stable self-locking for a wide range of feedback conditions, thus forcing the laser frequency to match that of the resonance frequency of cavity 46. A variety of reference cavities have been tested for the optical locking system. These cavities had free spectral ranges varying from 250 MHz to 7.5 GHz, and resonance widths ranging from 4 to 75 MHz.

Consequently, beam 54 has the desired optical characteristics of a maximum power at the cavity's resonance frequency when it is returned back through the geometrical axis to beam splitter 26, where a small portion is transmitted therethrough as beam 56 and the rest is reflected as an injected portion 58 back into laser 20. Type I beam 52, is directed away from the geometry leading to laser 20 in order to maximize the critical affect of the present invention of providing an optical feedback or an enhanced optical feedback only at the resonance frequency of cavity 46. Allowing optical feedback of type II to return to diode 20 results in a self-stabilizing positive feedback which narrows the linewidth of laser 20 and locks its frequency to the cavity frequency.

The strong coupling of the laser optical field to the carrier density in semiconductor laser 20 means that the laser gain conditions are highly sensitive to optical feedback. Enhanced feedback at the resonance of the separate high-Q cavity results in increased gain for the laser system precisely at that resonant frequency. With the separate cavity designed to have a high spectral resolving power, the feedback induced enhancement of the laser system gain occurs over a very narrow frequency interval. This narrow gain peak forces the laser frequency to "lock" to the cavity resonance. Having a high-Q optical locking cavity greatly improves the spectral narrowing and frequency control of the semiconductor laser relative to the methods of frequency stabilization described in the prior art. In operation of a system according to the present invention, narrow spectral widths as small as 3 KHz have been obtained. The ratio of the Q of cavity 46 to that of the intrinsic diode laser cavity is large and commonly ranges from $10^3$ to $10^7$. For this large ratio of Q's, the spectral characteristics of the optically coupled system, semiconductor laser and reference cavity are dominated by the high-Q reference cavity 46.

A plurality of piezo-electric translators are used to provide electrical signals to better control the system. Thus, a piezo-electrical translator 60 mounted on the back of mirror 38 is used to optimize the feedback phase relative to the undisturbed laser. Piezo-electrical translator 62, located on the back of output mirror 44, is used to scan the reference cavity and in turn the optically locked laser frequency. Finally, a photodetector 64 located to receive transmitted beam portion 50 from output mirror 44 monitors the transmitted power.

Figure 2:
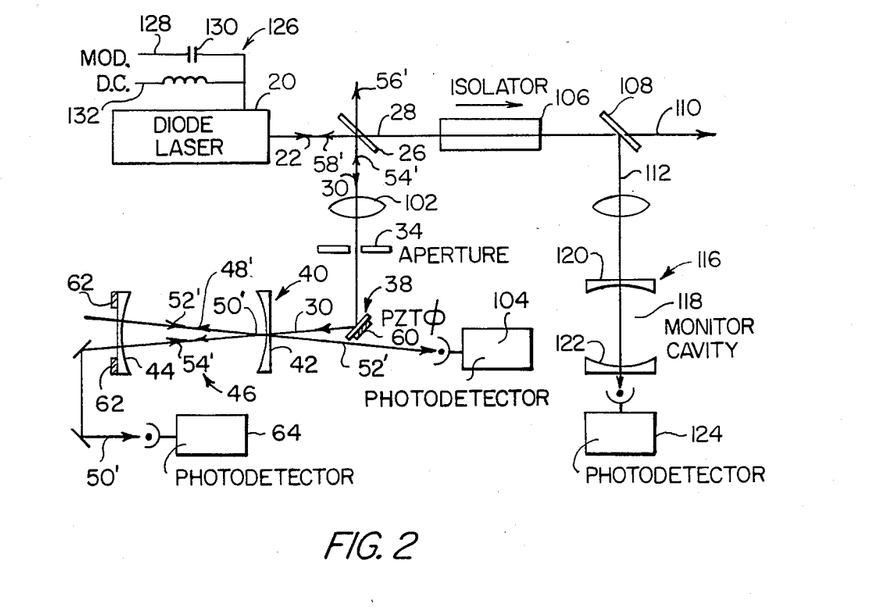
FIG. 2 is a schematic block diagram similar to that depicted in FIG. 1, but with additional elements and incorporating modulation control of the diode laser.

With reference now to FIG. 2, a slightly modified diode laser system according to the present invention is depicted. In the geometry of the system depicted in FIG. 2, the resonant optical feedback returns to laser 20 and automatically locks a laser frequency to the resonance frequency of cavity 46 in the same way as described above with respect to FIG. 1. Piezo-electrical translators 60 and 62 are used to optimize the feedback phase and control the cavity frequency, respectively, the same as in FIG. 1. However, a lens 102 replaces variable attenuator 32 and serves much the same function as lens 36. In addition, the geometries of FIG. 2 are such that the sampled beam 30 enters resonator 40 above the optical axis thereof and results in the same optical characteristics, but with a mirror image of the optical paths. Furthermore, the type I beam 52' reflected from input mirror 42 is monitored by a photodetector 104, whereas photodetector 64 is used to monitor the transmitted beam portion 50 of sampled beam 30 which exits from output mirror 44.

The stabalized laser system depicted in FIG. 2 has an additional monitor system coupled to output beam 28. In order to prevent any effects from this additional system, the output beam 28 travels through a conventional optical isolator 106 where it impinges on a second beam splitter 108. Beam splitter 108 divides output beam 28 into a transmitted beam 110 which now becomes the usable output from diode laser 20 and a second sampled beam 112. Sampled beam 112 then enters a second resonator 116 having a monitor cavity 118 formed by an input mirror 120 and an output mirror 122. However, beam 112 enters along the optical axis of monitor cavity 118 so that the type I and type II beams of resonator 40 are not generated. The output from resonator 116 is monitored by photodetector 124.

Finally, the system of FIG. 2 also includes a signal input circuit 126. Input circuit 126 is comprised of an RF modulation leg 128 that includes a capacitor 130 and a DC injection current leg 132. Thus, the standard driving current for diode laser 20 can be modulated with an RF signal added through circuit leg 128.

In the operation of the present invention according to the embodiments of FIG. 1 and FIG. 2, the off-axis geometry insertion of sampled beam 30 ensures that laser 20 sees a positive optical feedback only when the laser frequency precisely matches the frequency of resonance of cavity 46. This optical lock usually operates in the low feedback limit, and typically requires an optical feedback power of about $10^{-4}$ of the laser output power. When laser 20 operates exactly or close to the resonant frequency of cavity 46, a spectrally cleaned laser field has been built up in cavity 46 and leaks back through cavity input mirror 42 to return to laser 20 where it increases the laser gain at that frequency. This frequency-selective gain enhancement forces laser 20 to lock to the resonance frequency of cavity 46. The result is that the frequency of laser 20 is stabilized to the resonance frequency of cavity 46 and the usual 20 MHz linewidth is reduced to less than 10 kHz.

Figure 3:
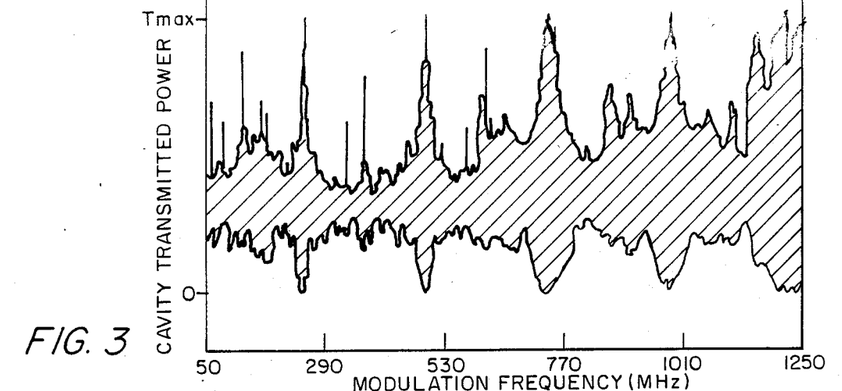
FIG. 3 is a graph of the measured results of the power transmitted through the optical locking cavity as seen by photodetector 64 in FIG. 2 when modulation is applied to the injection current.

FIG. 3 was produced by the system depicted in FIG. 2 and represents a graph of the power transmitted through optical locking cavity 46 with a free-spectral-range of 245 MHz with a finesse of 10 and as detected by photodetector 64. The power is shown in FIG. 3 as a function of the frequency of modulation applied through circuit 128 to the injection current. The modulation frequency was swept slowly from 50 to 1,250 MHz. Points of 0 and maximum transmission are indicated on the vertical axis. The sharp peaks indicate the resonant nature of the stability of the optical lock as a function of modulation frequency. The large evenly spaced peaks correspond to modulation at the frequency of the cavity free spectral range (i.e., at 245 MHz) and its harmonics. The smaller resonant peaks occur when the modulation frequency is related to the cavity resonant frequency by a noninteger rational number. A modulation current of about 5 ma was added to the DC injection current of 95 ma (about 1.7 times threshhold). The commercial laser used was a single-mode AlGaAs laser operating near 850 nm, which was not modified in any way.

Modulation of the injection current of the commercial semiconductor lasers which were not stabilized results in both amplitude and frequency modulation of the laser output. At least in the limit of low modulation index, the temporal characteristics of the laser electric field, E(t), can be represented by the following formula:

$$E(t) = A[1 + m\cos(w_m t)]\sin[wt + B\cos(w_m t + O)]; \quad (1)$$

where A is the field amplitude, w/(2PIE) is the laser carrier frequency, $w_m$/(2PIE) is the modulation frequency, and m and B represent the amplitude and frequency modulation indices respectively. The resulting frequency-domain spectra can be described by the usual sum of AM plus FM sidebands (with Bessel function amplitudes), except that the relative phase, theta (which is represented by "O" in the formula) between AM and FM is frequency dependent. It was found that when the present invention was modulated at low frequencies (typically $w_m$ is less than 200 MHz), the frequency modulation is suppressed by the optical lock relative to that of an unstabled laser. On the other hand, for low modulation index (B less than or equal to 0.6), any modulation frequency that is large compared to the effective optical servo bandwidth (100 to 200 MHz), the laser FM modulation characteristics are almost unchanged by the optical feedback lock. In this case, the modulation sidebands are reflected from cavity 46 into type I beam 52', and thus do not return to the laser. Because resonator 40 has a high-Q resulting in a high spectral resolving power, optical frequencies outside the bandpass of cavity 46 are rejected by the filtering action thereof. On the other hand, there are special frequencies that are exceptions to these generalizations, and they strongly affect the frequency modulation characteristics of an optically stabilized semiconductor laser system according to the present invention.

With certain modulation conditions, some or all of the modulation sidebands can resonate with reference cavity 46 (with or without the carrier), in which case they are returned to the laser and reinforce the optical lock. In particular, optical sidebands have frequencies that correspond to the resonant frequency (or its harmonics) of cavity 46 or simultaneously resonant with cavity 46 and are fed back to laser 20 along with the carrier. Cavity 46 does not phase shift these resonant sidebands relative to the carrier, so allowing them to return to laser 20 actually helps to stabilize the optical lock. In this way, it is possible to modulate the current of laser 20 with a high modulation index beta (B) and generate many sidebands without disrupting the frequency stabilization and linewidth narrowing provided by the optical feedback lock.

Referring again to FIG. 2, the tallest, evenly spaced, sharp resonances depicted in the graph occur when the modulation is at frequencies integrally related to the resonant frequency of cavity 46, which in this case as stated above, was 245 MHz. Good optical locking is observed at the modulation frequencies corresponding to these resonances. In addition, the power transmitted through cavity 46 is maximized because the laser carrier and the sidebands match cavity resonances. All of the cavity transmission resonances depicted in FIG. 2 correspond to modulation frequencies that are related to the resonant frequency of 245 MHz by rational numbers. In other words, the correspondence is given by the following formula which represents the modulation frequency:

$$\dot{w}_m/(2\text{PIE}) = (a/b)(245 \text{ MHz}); \quad (2)$$

where a, b equals the integral numbers of 1, 2, 3,... The smaller resonances depicted in FIG. 2 occur when the ratio, (a/b) is not an integer. This rational relationship between the modulation frequency and the cavity resonance frequency for stable optical locking can be understood by realizing that every sideband "b" can resonate with every cavity mode "a". For example, a modulation at 367 MHz corresponds to the ratio a/b = 3/2. This means that when the carrier is resonant with a cavity mode, every other sideband will be simultaneously resonant with every third cavity mode. This situation gives stable optical locking with roughly half of the available power resonant with cavity 46. It has been observed that these resonant enhancements in the optical lock for many modulation frequency-to-resonant frequency ratios exist where a = 1 to 9, and b = 1 to 5. In principal, some optical locking occurs for any modulation frequency that is related to the cavity resonant frequency by a rational number, but in general as "b" gets larger, less and less of the available optical power is resonant with the cavity modes and hence, the optical lock is less effective. Thus, the strength of a particular resonance depends on the number and size of the sidebands that are resonant with cavity modes, and thus depends strongly on the modulation index beta (B) and the value of "b".

The frequency domain power spectra of an optically locked laser that is modulated at one of the resonances, as described above, consists of an array of frequency stabilize, narrow linewidth laser lines separated by the modulation frequency. The amplitude of the carrier and sidebands depends on the actual modulation indices of both AM and FM and their relative phase as well as the feedback conditions. With simple direct modulation of the injection current at a frequency matching one of these locking resonances, it is possible to obtain a very high, effective frequency-modulation index while maintaining a perfectly stable optical lock.

When the resonator feedback to laser 20 utilizes the type II feedback from beam 50' and its frequency is far from matching the resonance frequency of cavity 46, there is no optical feedback and the laser frequency scans as usual with changes in the injection current. However, as the laser frequency approaches a resonance frequency of cavity 46, resonance feedback occurs. Then, the laser frequency locks to the cavity frequency, even if the laser current frequency continues to scan. The actual frequency range over which the diode laser locks is a function of the feedback power level and the phase the feedback light relative to that of the unperturbed laser. The optical locking of the frequency of laser 20 to the reference resonance frequency of cavity 46 is monitored by photodetector 64. The signal produced by photodetector 64 is depicted as the lower trace in FIG. 4.

Figure 4:
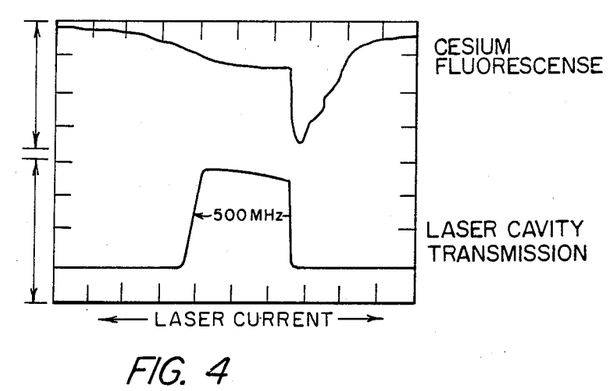
FIG. 4 is a graph of the power transmitted through the cavity, shown in the lower trace, as well as the power from the fluorescence from a cesium cell as the laser frequency scans from left to right across the 852 nm cesium resonance shown in the upper trace.
Figure 5:
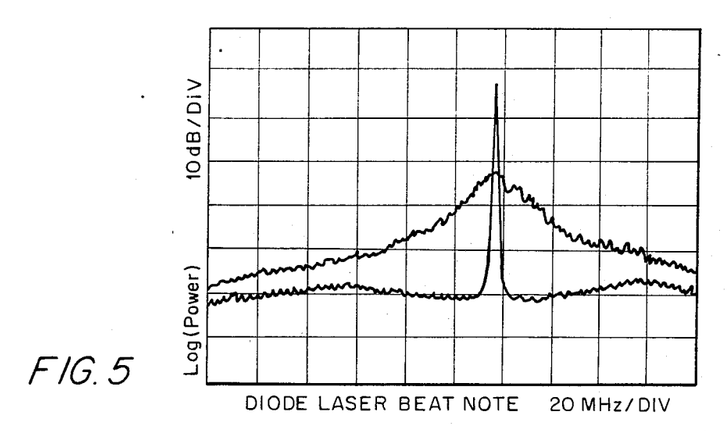
FIG. 5 is a graph of the beat-note between two semiconductor lasers according to the present invention wherein the upper trace is with one laser stabilized and the other laser is free running and unstabilized, and the lower trace shows the beat-note when both lasers are locked to separate reference cavities.
Figure 6:
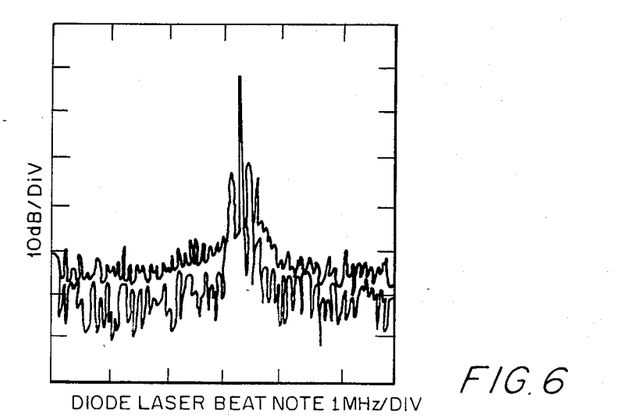
FIG. 6 is a graph of the diode-laser beat-note using a higher resolution of a particular laser system (according to the present invention resulting in a 20 kHz linewidth being achieved.

Proof that the present invention works is shown by referring to FIGS. 4 through 6. In FIG. 4, there is depicted an unusual Fabry-Perot transmission function, which has a flat top and a width approximately ten times larger than the actual cavity resonance width of 50 MHz. This shape is a manifestation of the fact that the frequency of laser 20 is not scanning with the laser current, but rather is locking to the frequency of peak transmission of the resonance frequency of cavity 46. The frequency locking is further demonstrated in the upper trace of FIG. 4. This trace shows a simultaneous record of the fluorescence from a cesium cell as the output from laser 20 is scanned over the 852 nm cesium resonance line. The upper trace shows that when the frequency of laser 20 is far from the peak of the resonance frequency of cavity 46 (shown in the lower trace), the laser frequency scans smoothly over the cesium resonance as the laser current is varied. The self-locking, which stabilizes the laser frequency, is evidenced by the abrupt flattening in the scan of the fluorescent signal as well as the cavity transmission function. At the end of the 500 MHz locking range, the laser abruptly drops out of lock and is reflected in the upper trace as a discontinuity in the curve which then resumes in an asymptotic curve as the laser continues to scan over the cesium resonance.

In order to determine unambiguously the spectral characteristics of an optically locked semiconductor laser, the beat-note between two lasers that are independently locked to different reference cavities can be observed. Direct observation of the beat-note spectra avoids many of the uncertainties and errors that plague measurements of laser frequency stability and linewidth using delayed-self-heterodyne and electronic residual-error-signal techniques.

With reference to FIG. 5, the display from an rf spectrum analyzer is reproduced and shows the detection of the beat-note utilizing a fast photodiode. The upper trace shows the beat-note when one of the two lasers is free running without feedback while the other laser is optically locked. The sharply peaked lower trace is obtained when both of the lasers are optically locked to their respective independent reference cavities. This lower trace indicates the dramatic linewidth reduction that is instantly achieved with the present invention. In the locked case, the width of the displayed beat-note is limited not by the laser linewidth, but rather by the resolution bandwidth of only 300 kHz of the rf spectrum analyzer used in the experiment.

Higher resolution measurements of the beat frequency is depicted in FIG. 6. This shows that the actual spectral width of the beat-note can be less than 20 kHz. The 20 kHz width is inferred from the two arrows on the central peak, which are separated by $-16$ dB and 13 kHz, the spectrum-analyzer resolution of 10 kHz and the sweep rate of 30 msec/division. The results of FIG. 6 prove that the present invention achieves a narrowing of the semiconductor linewidth by a factor of about 1,000 (from 20 MHz to 20 kHz). It is further noted that this narrowing was achieved solely by the use of an optical feedback without any electronic control.

The exemplary systems depicted in FIGS. 1 and 2 are only one implementation of the concept of the present invention and other configurations are possible. Such alternative configurations are depicted in FIGS. 7 through 14. The actual path of the feedback light is not fundamentally important and as illustrated in these figures, a number of geometries are possible so long as the requirement for enhancement only at the resonant frequency of the external cavity is satisfied. In most cases, the fraction of the power fed back to the lasers is in the range of $10^{-2}$ to $10^{-5}$ of the power inside a free running-unperturbed, laser cavity.

In FIGS. 7 through 14, common elements are designated by numbers that have the same 10's and units figures and different 100's figures are used for FIGS. 7 through 14, respectively. Thus, for example, each system comprises a laser 320, 420, 520, 620, 720, 820, 920, 1020 and 1120 for FIGS. 7, 8, 9, 10a, 10b, 11, 12, 13 and 14, respectively. In addition, the 10's and units designation of each element corresponds to that utilized in FIGS. 1 and 2 where, for example, the diode laser is designated by the numeral "20".

Figure 7:
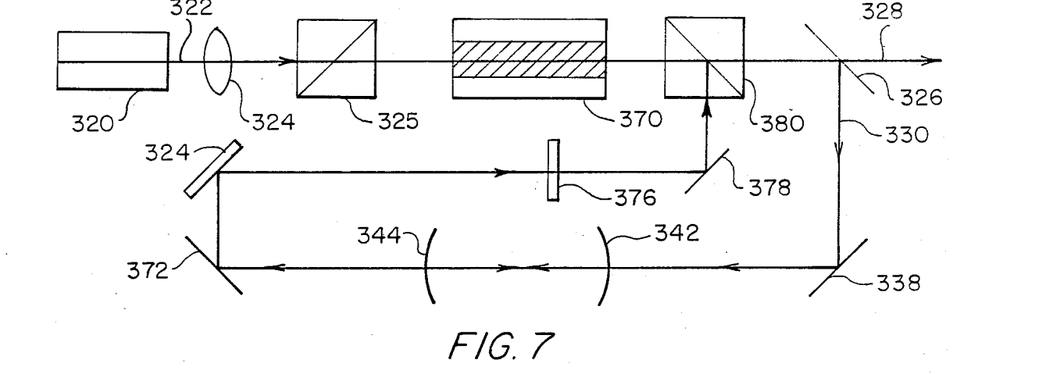
FIG. 7, 8, 9 and 10 are all highly schematic diagrams of other embodiments of the present invention depicting alternative paths for the feedback light.
Figure 8:
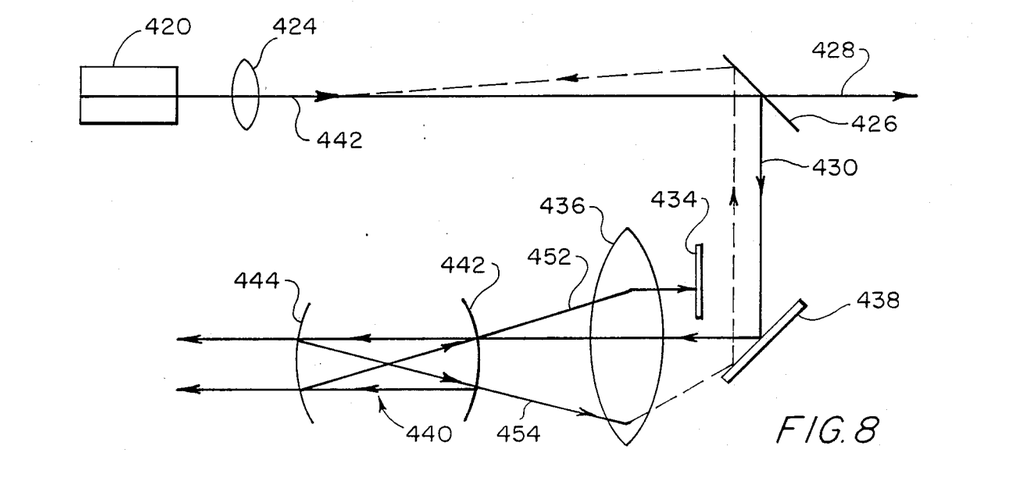

In FIGS. 7 and 8, laser 320 and 420 provide an output beam 322 and 422, respectively, to a beam splitter 326 and 426, respectively, and a redirectional mirror 338 and 438, respectively, to a cavity 340 and 440, respectively, comprised of an input mirror 342 and 442 and an output mirror 344 and 444, respectively. Both systems utilize a lens 324 and 424, respectively, but in the system of FIG. 7, emitted beam 322 is fed through a polarizer 325 and an isolator 370. Also, in the system of FIG. 7, the output from cavity 340 is transmitted through a separate path comprised of a directional mirror 372, an adjustable mirror 374 having an attached piezo-electric translator similar to translator 60 in FIGS. 1 and 2. The output path then travels through a half-wave plate 376 and a directional mirror 378 into a beam splitter 380. Beam splitter 380 returns the feedback beam to laser 320, yet still permits emitted beam 322 to be transmitted therethrough.

FIG. 8 depicts another system that utilizes a separate return path for the feedback beam, but the feedback path travels along essentially the same course that the sampled beam 430 travels. In the embodiment of FIG. 8, the optics are set up such that lens 436 focuses sampled beam 430 parallel to, but spaced from the axis of symmetry of resonator 440. This produces the conventional figure eight shaped four-port resonator having two outputs at input mirror 442. One of the outputs, beam 452, is comprised of a reflected portion and is blocked from the return path to laser 420 by an aperture 434. The other emitted output beam at input mirror 442, beam 454, is focused by mirror 436 onto directional mirror 438 back into laser 420.

Figure 9:
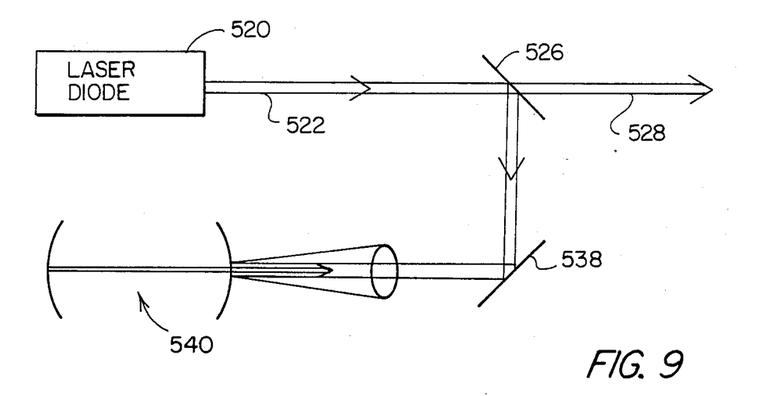
Figure 9A:
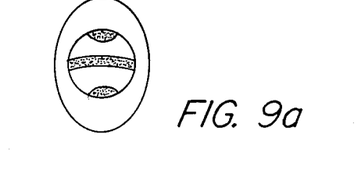

In FIG. 9, an embodiment of the present invention utilizes a type I beam (i.e., a beam containing a reflected contribution) for the feedback and requires nonuniform interference between the input beam and the cavity leakage field in order to ensure enhanced feedback on resonance. Such nonuniform interference is, in fact, usually observed in this type I beam when using semiconductor lasers and separate spherical mirror resonators. This is because the transverse mode structure of the semiconductor laser does not match the Eigenmodes of the spherical mirror cavity resonator. As a result, it is possible to observe interference fringes, such as depicted in FIG. 9a, and it is possible to align the system using conventional techniques so as to produce a positive feedback when the frequency of emitted beam 522 from laser 520 matches the resonance frequency of cavity 540.

Figure 10A:
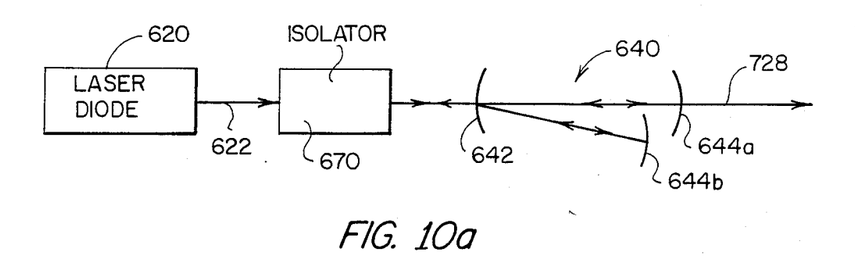
Figure 10B:
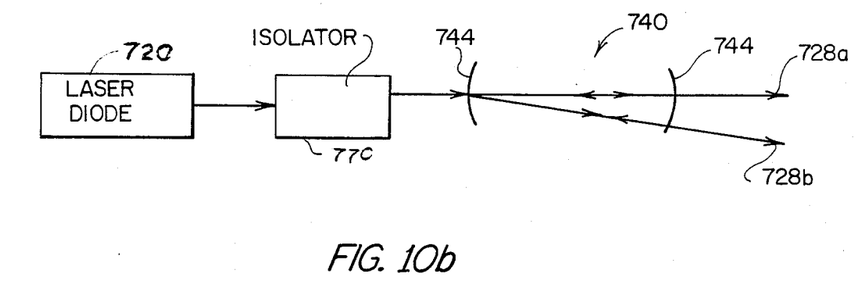

The embodiments depicted in FIGS. 10a and 10b utilize the resonator cavities 640 and 740, respectively, as a spectral filter and the entire emitted beam 622 is directed through the respective cavity 640 and 740. Optical isolators 670 and 770 in FIGS. 10a and 10b, respectively, are used to maintain the low feedback level to the laser. The important advantage of the geometry in these figures is that optical cavity resonators 640 and 740 act to spectrally and spatially filter the laser output beam. This filter can then remove the high frequency phase noise (including that due to the relaxation oscillation) that is a notorious problem with diode lasers and results from the dynamics of the photons and carriers within the semiconductor material. With proper optical impedance matching, the filtered laser power transmitted through cavity 640 and 740 can be the majority of the power available from lasers 620 and 720, respectively.

In addition to stabilizing a laser to a single frequency by purely optical means as described above, the present invention can also incorporate some electronic techniques. Some of these techniques allow the laser frequency to be scanned continuously (or scanned in discrete steps) while maintaining the optical lock and the narrow linewidth. In addition, controls can be used to adjust the optical path length so that the phase of the optical feedback can be made equal to the emitted beam. For example, the phase of injected beam portion 58, FIG. 1 can be adjusted by providing a signal to piezoelectric translator 60 in FIGS. 1 and 2. This control system is shown in FIGS. 11 through 14.

As in FIG. 1, in FIGS. 11 through 14 the standard system according to the present invention comprises a semiconductor laser (820, 920, 1020, or 1120) which emits a beam of coherent light (822, 922, 1022, or 1122). The emitted beam is split by a beam splitter (826, 926, 1026, or 1126) into an output beam (828, 928, 1028, or 1128) and a sampled beam (830, 930, 1030, or 1130), the sampled beam being directed by a mirror (860, 960, 1060, or 1160) into an optical confocal cavity (840, 940, 1040, or 1140) that comprises an input mirror and an output mirror (842 and 844, 942 and 944, 1042 and 1044, or 1142 and 1144). However, each of the systems in FIGS. 11 through 14 also employs an electronic feedback circuit to provide an additional electronic control. Without such additional control, a typical optical locking system could have a locking range of 100 to 500 MHz (in units of optical frequency). The locking range depends mainly on the power level of the optical feedback with some additional dependence of the optical lock on the phase difference between the optical feedback and the emitted beam.

If a free running laser frequency is within an optical locking range of a cavity resonance, the frequency will lock optically to the cavity resonance frequency. Conversely, if the cavity resonance frequency is scanned within that range, the cavity will then pull the laser frequency with it. In order to scan the optically locked laser frequency over a wider frequency interval, the electronic control systems for the feedback phase and the laser injection current disclosed in FIGS. 11 through 14 can be used. These control systems can be used to maintain automatically the optimum laser current and feedback phase relative to the reference cavity.

Figure 11:
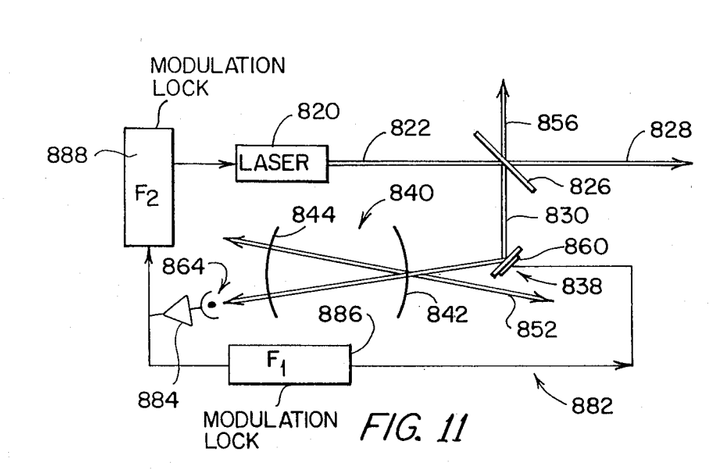
FIGS. 11, 12, 13 and 14 disclose highly schematic diagrams incorporating further embodiments of the present invention which further utilize servo loops.

With reference now to FIG. 11, in addition to the aforedescribed optical system disclosed therein, there is also disclosed an electronic feedback circuit 882. Feedback circuit 882 employs a photodetector 864 (equivalent to photodetector 64 in FIGS. 1 and 2) whose signal is amplified by an amplifier 884. The output from amplifier 884 is divided between two modulation-lock servo loops, a first loop comprising a modulation lock 886 for adjusting the path length of the optical feedback signal with translator 860 and a second loop encompassing modulation lock 888 for modulating the laser current of laser 820. The latter modulation signals provide correction directly to the laser current and maintain a free running laser frequency within the optical locking range.

Figure 12:
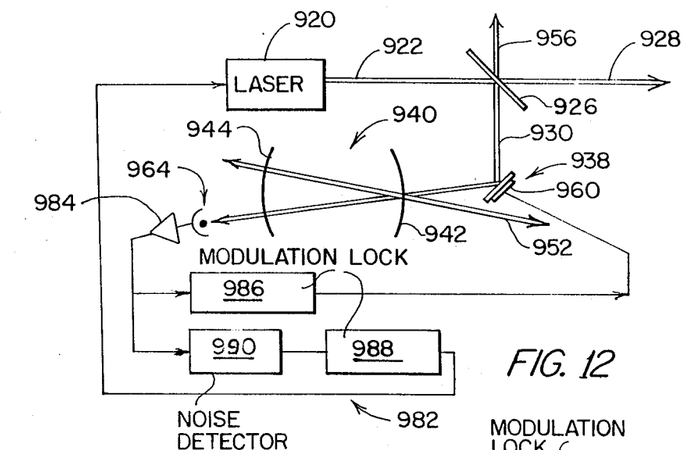

A modification of electronic feedback circuit 882 of FIG. 11 is depicted as feedback circuit 982 in FIG. 12. Circuit 982 is used to detect the optimum laser current setting relative to the resonance frequency of a cavity of resonator 940 in order to obtain an optical lock. Circuit 982 includes a corresponding photodetector 964 and amplifier 984, but now the output of amplifier 984 is divided between a modulation lock 986 (which corresponds to modulation lock 886 of FIG. 11) and a noise detector 990. The output of noise detector 990 is fed to a second modulation lock 988, which in turn provides a modulation signal to control the current of laser 920. Thus, circuit 982 is used as a servo-loop to minimize the noise detected in transmission through the cavity of resonator 940.

The circuit components that comprise modulation locks 886 and 986, 888 and 988, and noise detector 990 are conventional and are apparent to those skilled in the art.

Figure 13:
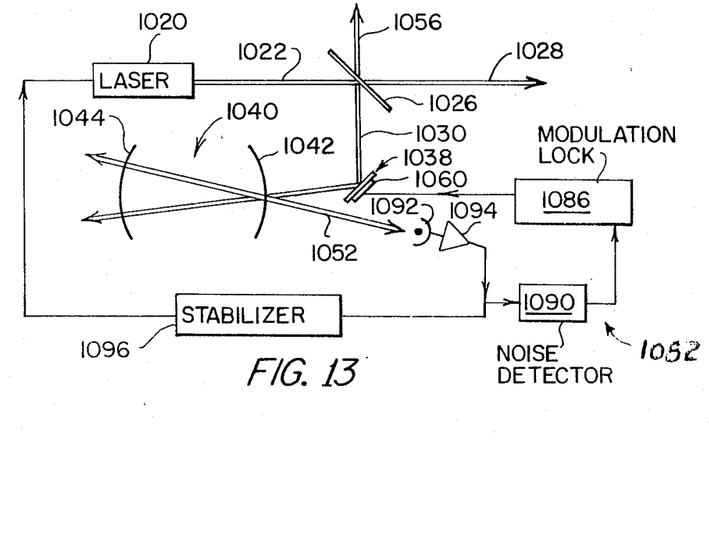

FIG. 13 discloses an electronic control circuit 1082 that utilizes optical heterodyne locking techniques for active control of the current of laser 1020 so that the free running laser frequency remains within the optical locking range of resonator 1040.

Circuit 1082 comprises a photodetector 1092 which receives type I reflected beam 1052 and which produces a signal that is amplified by an amplifier 1094. The output of amplifier 1094 is provided to a noise detector 1090 and to a stabilizer 1096. Stabilizer 1096 is a Pound-Drever-Hall stabilizer of the conventional type that produces both the injection current for laser 1020 as well as impressing on that current and RF frequency modulation signal. The output from noise detector 1090 feeds a modulation lock 1086 which controls a piezo-electric translator 1060 in order to control the feedback phase.

Figure 14:
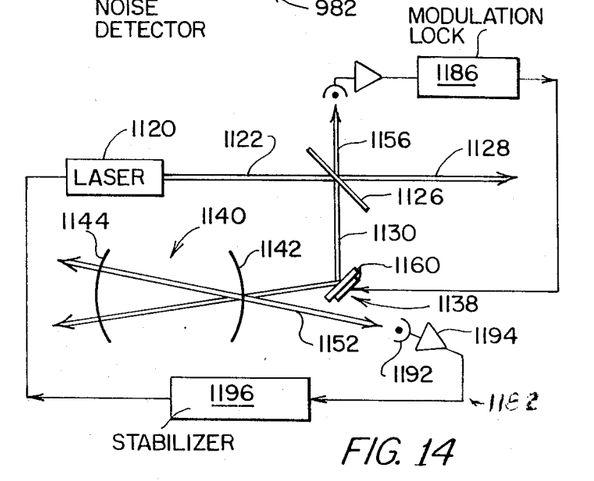

FIG. 14 is similar to FIG. 13 in function except that the electronic control circuit 1182 is divided into two independent servo loops. A first servo loop is comprised of a photodetector 1192 coupled to an amplifier 1194 for receiving the type I resonator output signal and supplying the electronic equivalent thereof to a Pound-Drever-Hall stabilizer to control the laser current to laser 1120. The other electronic circuit incorporates a photodetector 1198 that monitors the transmitted type II beam portion 1156 emitted from beam splitter 1126 from the feedback loop. The output of photodetector 1198 is sent to a modulation lock 1186 through a amplifier 1199. The output from modulation lock 1186, provides a signal to drive piezo-electric translator 1160, as described above with respect to the circuits in FIGS. 11 through 13.

The electronic servo systems depicted in FIGS. 11 through 14 are just a few examples of the many possible configurations. In each case, resonators 840, 940, 1040, and 1140 provide four optical outputs. Three of the outputs are equivalent, whereas outputs 852, 952, 1052, and 1152 have the opposite sign from the three other corresponding outputs and a DC offset due to the directly reflected input beam. However, it would be obvious to those skilled in the art, in view of the foregoing, that any one of these four outputs or a combination thereof, can be used to provide error signals for either or both of the two servo loops.

The additional electronic control circuits also ensure that the optical lock is stable for indefinitely long periods of time and minimize or remove the problems that occur from the inevitable drifts in the optical feedback phase and laser operating frequency. For example, should the diode laser temperature, current or aging, cause the free running laser frequency of lasers 820, 920, 1020, or 1120 to drift, the electronic feedback controls could be used to keep the frequency within the locking range and otherwise to prevent the occurrence of an unlocked condition or the locking on another cavity mode.

The present invention has been described with respect to presently preferred embodiments thereof. In particular, the present invention utilizes a resonant, frequency selective optical feedback from a high-Q resonator to stabilize the frequency of a semiconductor laser. Such frequency stabilization means that the center frequency of the laser oscillation is stabilized to the resonance frequency of the resonator cavity and that the laser linewidth is reduced substantially. Different optical circuits have been described with different optical geometries which provide frequency selective optical feedback when the laser oscillation frequency matches the reference cavity resonance frequency. The optical feedback is resonately enhanced or is present only when the laser frequency matches the reference cavity resonance frequency. In addition, the optical feedback locks of the present embodiments utilize only weak optical feedback signals to force the laser frequency to automatically self-lock to the reference cavity resonance frequency. This is accomplished without any modification to the conventional semiconductor diode lasers, and for many applications as described above, can be implemented without any additional electronic controls whatsoever.

Also disclosed herein was application of additional electronic control systems to the optical feedback locking loop in order to ensure an optimum optical locking. The electronic control systems develop error signals to serve in control loops for optical feedback phase adjustment and the centering of the laser frequency or adjusting the reference cavity resonance frequency.

The present invention provides several novel combinations to a semiconductor laser system. A transmission signal from the optical cavity of the resonator was found to be maximized at the optical lock and that fact can be used for independently setting the feedback phase and the relative frequency of the laser to the frequency of the resonator. Thus, a single detector, if desired, can be used to independently optimize these two variables. In addition, electronic noise detectors can be used within electronic control loops to establish appropriate error signals and to drive phase locked loops to make the requisite corrections. Finally, an optical heterodyne locking technique can be successfully applied in the optical feedback locked semiconductor laser. Such heterodyne locking techniques can provide both long term and short term lasers stability.

The same electronic control system can be used to optimize the phase in the optical feedback loop and can be implemented with an appropriate phase shifter such as a piezo-electrically translated mirror, galvo-plates and electric-optic phase shifters. In addition, the present invention can be utilized in a geometry in which the output from the laser system is transmitted from the resonator or reference cavity, thereby providing additional spectral and spatial filtering for the laser.

The present invention, by utilizing an optical feedback locking method, does not sacrifice the modulation characteristics of the semiconductor laser, although such conditions certainly are altered by the optical lock. Even with the very narrow laser linewidths, the optically locked lasers can be still frequency modulated with a high degree of efficiency. For some configurations, the optical feedback locking method also reduces the laser intensity noise as well as having most of the frequency noise removed. These and other advantages of the present invention would be obvious to those of ordinary skill in the art, but the scope of the present invention is determined by the claims appended hereto.

We claim:

1. A stabilized semiconductor diode laser system comprising:
    a semiconductor diode laser that emits a beam along a first axis; said laser having a laser optical field and a carrier density
    an optical resonator means, located external to said laser, having a resonator frequency, and including an input port for receiving said laser beam and an output port through which a beam exits said resonator means, said resonator means for producing an enhanced optical output at said output port only when an optical beam supplied at said input port has a frequency substantially equal or exactly equal to said resonant frequency;
    first means for optically coupling at least a portion of said beam to said input port; and second means for optically coupling said output port to said laser as a positive optical feedback thereto whereby inherent coupling of the laser optical field to the carrier density of said laser results in a locking of the laser output frequency.

2. A semiconductor laser system as claimed in claim 1 and further including a beam splitter for dividing said emitted beam into a sampled beam and a system output beam;

and wherein said first coupling means couples said sampled beam to said input port of said resonator means.

3. A semiconductor laser system as claimed in claim 2 wherein said input and said output port are the same.

4. A semiconductor laser system as claimed in claim 3 wherein said first coupling means and said second coupling means are the same.

5. A semiconductor laser system as claimed in claim 2 wherein said optical resonator means comprises a confocal resonator having an axis of symmetry.

6. A semiconductor laser system as claimed in claim 5 wherein said first means couples said sampled beam to said resonator at an angle to said axis of symmetry of said resonator.

7. A semiconductor laser system as claimed in claim 2 and further including means for changing the phase of the optical output of said resonator means.

8. A semiconductor laser system as claimed in claim 7 wherein said phase changing means comprises means optically coupled to receive optical radiation emitted by said resonator means and to convert said optical radiation into an electronic signal.

9. A semiconductor laser system as claimed in claim 8 wherein said phase changing means comprises a modulation lock means for receiving said electronic signal and for generating a correction signal; and wherein said second coupling means comprises a direction changing mirror mounted on a piezoelectric transducer means for providing movement of said mirror.

10. A semiconductor laser system as claimed in claim 7 and further including means optically coupled to receive optical radiation emitted by said resonator means for converting said optical radiation into an electronic signal;

and means for changing the laser injection current, said modulating means receiving said electronic signal as an input.

11. A semiconductor laser system as claimed in claim 7 wherein said resonator has four ports and produces a first output beam that contains a reflected portion of said coupled sample beam as well as an interfering component, and a second output beam that contains only a reflected portion of said sample beam; and wherein said second coupling means only couples said second output beam to said laser and blocks said first output beam.

12. A semiconductor laser system as claimed in claim 7 and further including means for monitoring the noise on an output from said resonator and for generating a correction signal to reduce said noise.

13. A semiconductor laser system as claimed in claim 2 and further including means for monitoring an output from said resonator for a frequency imbalance and for generating a correction signal to reduce said frequency imbalance.

14. A semiconductor laser system as claimed in claim 13 wherein said monitoring and generating means includes an RF heterodyne locking means.

15. A method for stabilizing a semiconductor laser that emits a beam comprising:

splitting off a portion of said emitted beam to provide a sample beam;

coupling said sampled beam to an optical resonator located external to said laser and having a resonant frequency;

coupling the output of said resonator back to said laser as a positive feedback only when the frequency of said laser is equal to or substantially equal to said resonant frequency.

* * * * *